United States Patent
Rustamov

(10) Patent No.: US 10,838,444 B1
(45) Date of Patent: Nov. 17, 2020

(54) ADAPTIVE CONSTANT CURRENT ENGINE

(71) Applicant: SEMICONDUCTOR COMPONENTS INDUSTRIES, LLC, Phoenix, AZ (US)

(72) Inventor: Rovshan Rustamov, Glendale, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/662,234

(22) Filed: Oct. 24, 2019

Related U.S. Application Data

(60) Provisional application No. 62/878,595, filed on Jul. 25, 2019.

(51) Int. Cl.
   *G05F 1/565* (2006.01)
   *G05F 3/26* (2006.01)
   *G05F 1/56* (2006.01)
   *H03B 5/00* (2006.01)

(52) U.S. Cl.
   CPC .............. *G05F 1/56* (2013.01); *G05F 1/565* (2013.01); *G05F 3/262* (2013.01); *H03B 5/00* (2013.01); *Y10T 307/593* (2015.04)

(58) Field of Classification Search
   CPC ... G05F 1/10; G05F 1/46; G05F 1/461; G05F 1/56; G05F 1/561; G05F 1/565; G05F 1/573; G05F 1/613; G05F 1/618; G05F 3/02; G05F 3/08; G05F 3/26; G05F 3/262; G05F 3/265; G05F 3/267; Y10T 307/593
   See application file for complete search history.

(56) References Cited

U.S. PATENT DOCUMENTS

| | | | | |
|---|---|---|---|---|
| 5,237,262 | A * | 8/1993 | Ashley | G05F 1/567 323/282 |
| 6,479,975 | B1 * | 11/2002 | Plankensteiner | G01R 19/16519 323/313 |
| 7,170,790 | B2 * | 1/2007 | Demange | G11C 7/062 365/185.21 |
| 7,619,464 | B2 * | 11/2009 | Choy | G05F 1/46 327/54 |
| 10,168,363 | B1 * | 1/2019 | Petenyi | H02H 1/0007 |
| 2006/0077012 | A1 | 4/2006 | Shi et al. | |
| 2006/0132253 | A1 | 6/2006 | Gelhausen et al. | |

(Continued)

*Primary Examiner* — Levi Gannon
(74) *Attorney, Agent, or Firm* — Brake Hughes Bellermann LLP

(57) ABSTRACT

An adaptive constant current engine (ACCE) to control a current of a target load device at a constant level is disclosed. The ACCE includes a closed feedback loop which generates a sensed current that represents a load current conducted by the target load device and then compares the sensed current to a reference current. Based on this comparison, the circuit can output a voltage to control the current conducted by the target load device. The disclosed ACCE adapts the comparison to an operating voltage of the target load device in order to provide electrical conditions at a reference node receiving a reference current that are the same as electrical conditions at a sensing node receiving a sensing current. Accordingly, the ACCE can generate very accurate comparisons regardless of variations in the operating voltage of the target load device.

21 Claims, 5 Drawing Sheets

(56) References Cited

U.S. PATENT DOCUMENTS

| | | | |
|---|---|---|---|
| 2007/0268643 A1* | 11/2007 | Ong | G05F 1/573 |
| | | | 361/93.9 |
| 2012/0038343 A1* | 2/2012 | Takagi | G05F 1/561 |
| | | | 323/299 |
| 2012/0262137 A1 | 10/2012 | Arigliano et al. | |
| 2013/0088157 A1 | 4/2013 | Noda | |

* cited by examiner

ADAPTIVE CONSTANT CURRENT ENGINE

CROSS-REFERENCE TO RELATED APPLICATIONS

This application claims the benefit of U.S. Provisional Patent Application No. 62/878,595, filed on Jul. 25, 2019, the entire contents of which is incorporated herein by reference.

FIELD OF THE DISCLOSURE

The present disclosure relates to microelectronics and more specifically to an analog circuit for adaptively controlling a current in a separately functioning (i.e., remote) circuit.

BACKGROUND

It may be desirable to set and maintain (i.e., control) a constant current in a remote circuit. Control of the current using a feedback loop can include accurately sensing the current, comparing the sensed current to a reference current, and controlling the current based on the comparison. Direct sensing of the current may add complexity and cost at least because in some applications the current of the remote circuit is large. Indirect sensing of the current may lead to inaccuracies causes by variations in the remote circuit. For example, variations in electrical characteristics of the remote circuit can lead to sensing inaccuracies. A need exists for control of a current in a remote circuit using indirect sensing while maintaining accuracy by adapting the indirect sensing to variations in the remote circuit.

SUMMARY

In one aspect, the present disclosure generally describes a circuit. The circuit includes a reference current conveyer that is configured to receive a common load voltage at a first input and to receive a reference current at a second input. The reference current conveyer is configured to generate a reference-feedback voltage at an output based on the common load voltage and the reference current. The circuit also includes a sensing current conveyer that is configured to receive the common load voltage at a first input and to receive a sensed current at a second input. The sensing current conveyer is configured to generate a sensed voltage at an output based on the common load voltage and the sensed current. The circuit also includes a differential amplifier configured to receive the reference-feedback voltage at a first input and the sensed voltage at a second input. The opamp is configured to generate a control voltage at an output that corresponds to a difference between the sensed voltage and the reference-feedback voltage, and the difference is unaffected by variations of the common load voltage.

In another aspect, the present disclosure generally describes a method for setting and maintaining a load current in a target load device to a constant level. The method includes receiving a common load voltage from a remote circuit at an adaptive constant current engine including a load current sensing circuit, a sensing current conveyer, a reference current conveyer, and a differential amplifier. The method also includes applying the common load voltage to a first input of the sensing current conveyer and applying the common load voltage to a first input of a reference current conveyer. The method also includes obtaining a sensed current, which is a fraction of the load current, using the load current sensing circuit. The method also includes applying the sensed current to a second input of the sensing current conveyer. The method also includes receiving a reference current from a reference current source at the adaptive constant current engine and applying the reference current to a second input of the reference current conveyer. The method also includes generating a sensed voltage at an output of the sensing current conveyer based on the common load voltage and generating the sensing current and a reference-feedback voltage at an output of the sensing current conveyer based on the common load voltage and the reference current. The method also includes comparing the sensing voltage to the reference voltage to obtain a control voltage and applying the control voltage to the target load device to set and maintain the load current at a constant level.

In another aspect, the present disclosure generally describes a system for maintaining a constant current. The system includes a target load device in a remote circuit; the target load device having a common load voltage and conducting a load current. The system also includes a reference current source providing a reference current (e.g., constant reference current) proportional to the load current. The system also includes an adaptive constant current engine configured to sense a sense current that is proportional to the load current and compare the sensed current to the reference current to produce a control voltage that is coupled to the target load device to control the load current. The adaptive constant current engine includes a load current sensing circuit configured to receive the control voltage and generate the sensed current; a sensing current conveyer operating at a common load voltage from the remote circuit and generating a sensed voltage based on the sensed current; a reference current conveyer operating at the common load voltage from the remote circuit and generating a reference-feedback voltage based on the reference current; and a differential amplifier configured to generate the control voltage based on a difference between the sensed voltage and the reference-feedback voltage, the sensing current conveyer and the reference current conveyer being matched so that the difference is independent of the common load voltage.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
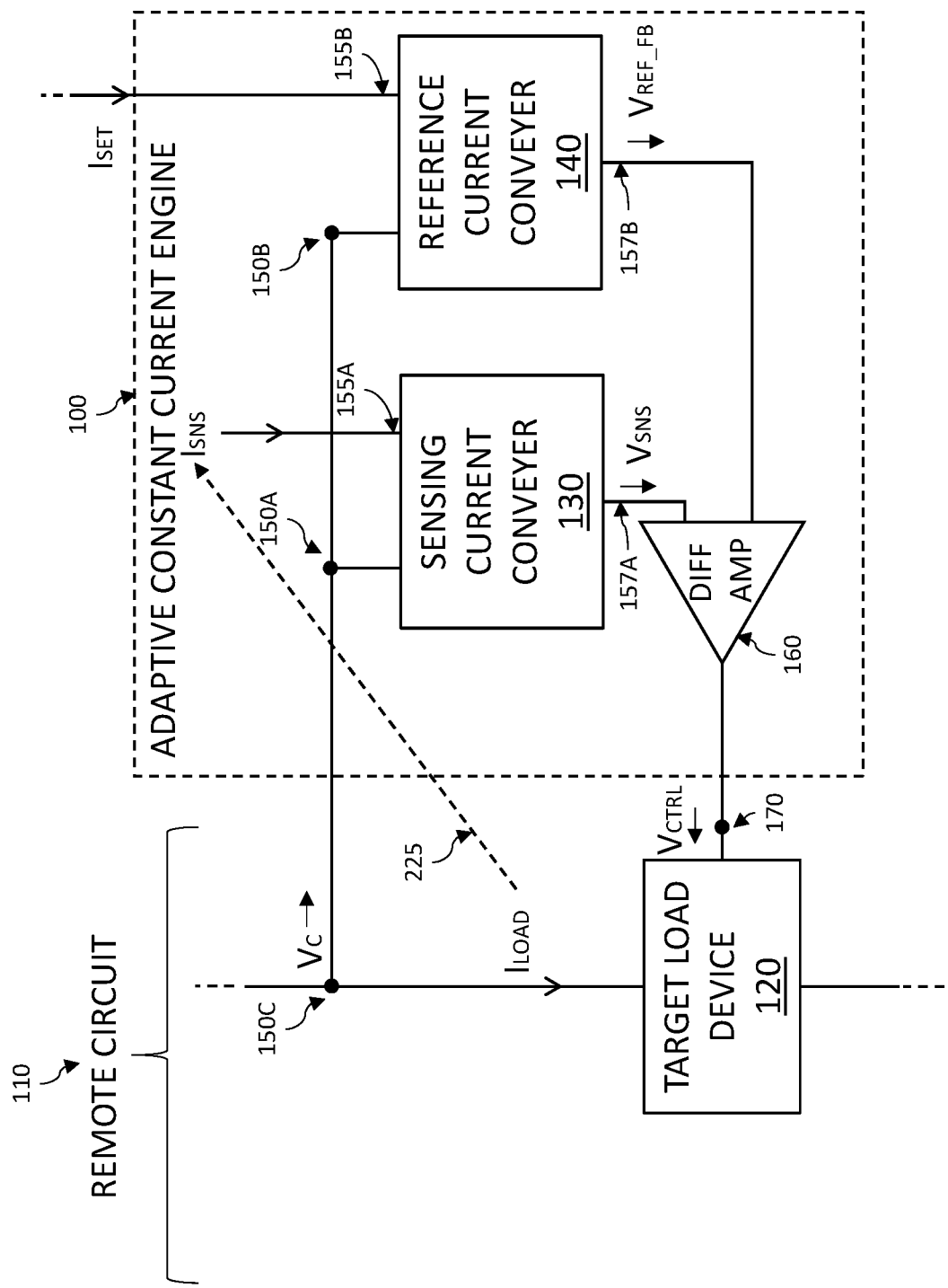
FIG. 1 is a block diagram of an adaptive constant current engine for controlling the current in a target load device.

The present disclosure describes circuits and methods to set and maintain (i.e., control) a current (e.g., at a node, through a device) of a physically separate and/or separately functioning (i.e., remote) circuit. To control the current (i.e., the load current), the circuit may control the operation of a target load device in the remote circuit. The target load device may be controlled using a closed feed back loop which generates a sensed current that represents (e.g., is a fraction of) the load current and then compares the sensed current to a reference current. Based on this comparison, the circuit can output a voltage to control the operation of the target load device. For this control to be accurate, possible variations in the operation of the target load device must not affect the control. For example, a target load device may conduct a particular load current at different operating voltages depending on the temperature of the target load device. In another example, a group of target load devices may each conduct a particular load current at slightly different operating voltages due to process variations (e.g., process corners). The disclosed circuits and methods adapt the measurement of the load current to the operating voltage of the target load device in order to effectively remove the operating voltage as a variable in the measurement. Accordingly, the disclosed circuits and methods may generate accurate (e.g., very accurate) comparisons of an indirectly sensed current (i.e., representing the load current) and a reference current, regardless of the operating voltage of the target load device.

A remote circuit may include a target load device that is embodied as a transistor device having a load current (i.e., $I_{LOAD}$) between two terminals (e.g., collector-emitter, source-drain) controllable by an electrical condition (e.g., current, voltage) at a third terminal (e.g., base, gate). In this case, the disclosed circuit may control $I_{LOAD}$ by controlling the third terminal of the transistor device with a control voltage (i.e., $V_{CTRL}$). Further, the disclosed circuit may include a load-current sensing circuit that creates a sensed current (i.e., $I_{SNS}$) that represents (i.e., is a percentage of) $I_{LOAD}$ based on this control voltage, and the control voltage may be generated as a result of a comparison between the sensed current and a reference current (i.e., $I_{SET}$). The disclosed circuit is configured to adapt the comparison to a voltage (e.g., a collector-emitter voltage, a source-drain voltage) of the transistor device. In this way, the disclosed circuit may accurately maintain the load current at a constant current. For at least this reason, the disclosed circuit may be referred to as an adaptive constant current engine (i.e., ACCE).

In order to generate the control voltage (i.e., $V_{CTRL}$), which controls a load current (i.e., $I_{LOAD}$) of the remote circuit (i.e., the circuit under control), the ACCE may receive as a first input, a common load voltage (i.e., $V_C$) sensed from a circuit node in the circuit under control. The ACCE may also receive as a second input, a sensed current (i.e., $I_{SNS}$) corresponding to $I_{LOAD}$. For example, $I_{SNS}$ and $I_{LOAD}$ may be proportional (e.g., $I_{LOAD}/I_{SNS}$=K, where K is a constant). The ACCE may also receive as a third input a set current ($I_{SET}$) that serves reference for the control of $I_{LOAD}$. $I_{SET}$ and $I_{LOAD}$ may be proportional (e.g., $I_{LOAD}/I_{SET}$=K). In a possible implementation, $I_{SET}$ is a fraction of a desired $I_{LOAD}$ and the ACCE is configured to generate and apply $V_{CTRL}$ to the remote circuit to make $I_{SNS}$=$I_{SET}$.

A generalized block diagram of a possible ACCE implementation is shown in FIG. 1. The ACCE 100 can be applied to any type of remote circuit 110, which has an $I_{LOAD}$ and a $V_C$ associated with a target load device 120. The ACCE 100 includes a feedback control loop that maintains $I_{LOAD}$ proportional to $I_{SET}$ under all conditions and is independent of process corner or temperature variations of the target load device (i.e., independent of variations in $V_C$). Instead of directly comparing measured current ($I_{SNS}$) and reference current ($I_{SET}$), the ACCE includes a pair of current conveyers: a sensing current conveyer 130 and a reference current conveyer 140. The sensing current conveyer 130 is configured to convert $I_{SNS}$ into a corresponding sensed voltage ($V_{SNS}$) and a reference current conveyer 140 is configured to convert $I_{SET}$ into a corresponding reference-feedback voltage ($V_{REF\_FB}$). The $V_{SNS}$ output of the sensing current conveyer 130 and the $V_{REF\_FB}$ output of the reference current conveyer 140 are compared using a differential amplifier 160 to produce a control voltage ($V_{CTRL}$) that is coupled to a controlling node (i.e., controlling terminal) 170 of the target load device 120 to adjust $I_{LOAD}$ conducted by the target load device 120. The control voltage corresponds to a difference between the sensed voltage and the reference-feedback voltage (e.g., $V_{CTRL} \rightarrow V_{SNS} - V_{REF\_FB}$). The difference is zero volts when $V_{SNS}$ equals $V_{REF\_FB}$ (i.e., when $I_{SNS}$ equals $I_{SET}$). Accordingly, a bias voltage may by applied (i.e., added to the difference) so that the voltage for controlling the target load device (i.e., $V_{CTRL}$) is not zero (i.e., always non-zero). In other words, the control voltage ($V_{CTRL}$) may include a bias voltage set by the differential amplifier (i.e., the opamp generates whatever control voltage is necessary to make $V_{SNS}$ and $V_{REF\_FB}$ the same).

The sensing current conveyer 130 and the reference current conveyer 140 are arranged and coupled in a butterfly configuration in which the current conveyers have substantially the same (e.g., identical) topologies (not shown in FIG. 1), matching devices (not shown in FIG. 1), and/or has corresponding input nodes (i.e., first inputs) 150A, 150B coupled to one another other. The corresponding first inputs 150A, 150B of the current conveyers are coupled to and both receive $V_C$ from a common voltage node 150C in the remote circuit so that the sensing current conveyer 130 and the reference current conveyer 140 operate at operating points that corresponds to the target load device and that are identical to each other. In other words, the common voltage (i.e., common mode voltage) is common to a node 150C in the remote circuit 110, a first input 150A of the sensing current conveyer 130, and a first input 150B of the reference current conveyer 140. In this configuration, the sensed current and the reference current experience a load condition that is substantially the same (e.g., identical). In this way, the pair of current conveyers 130, 140 can produce voltages (i.e., $V_{SNS}$, $V_{REF\_FB}$) for control that are independent of the common mode voltage ($V_C$). Accordingly, variations in $V_C$ do not significantly affect the control of the load current $I_{LOAD}$. Thus, the ACCE 100 can accommodate a variety (i.e., a range) of possible common voltages ($V_C$) without any significant change in operation. The ACCE's independence to $V_C$ allows it to be used with target load devices that may operate differently (i.e., have different $V_C$) based on process variations or temperature variations.

Figure 2:
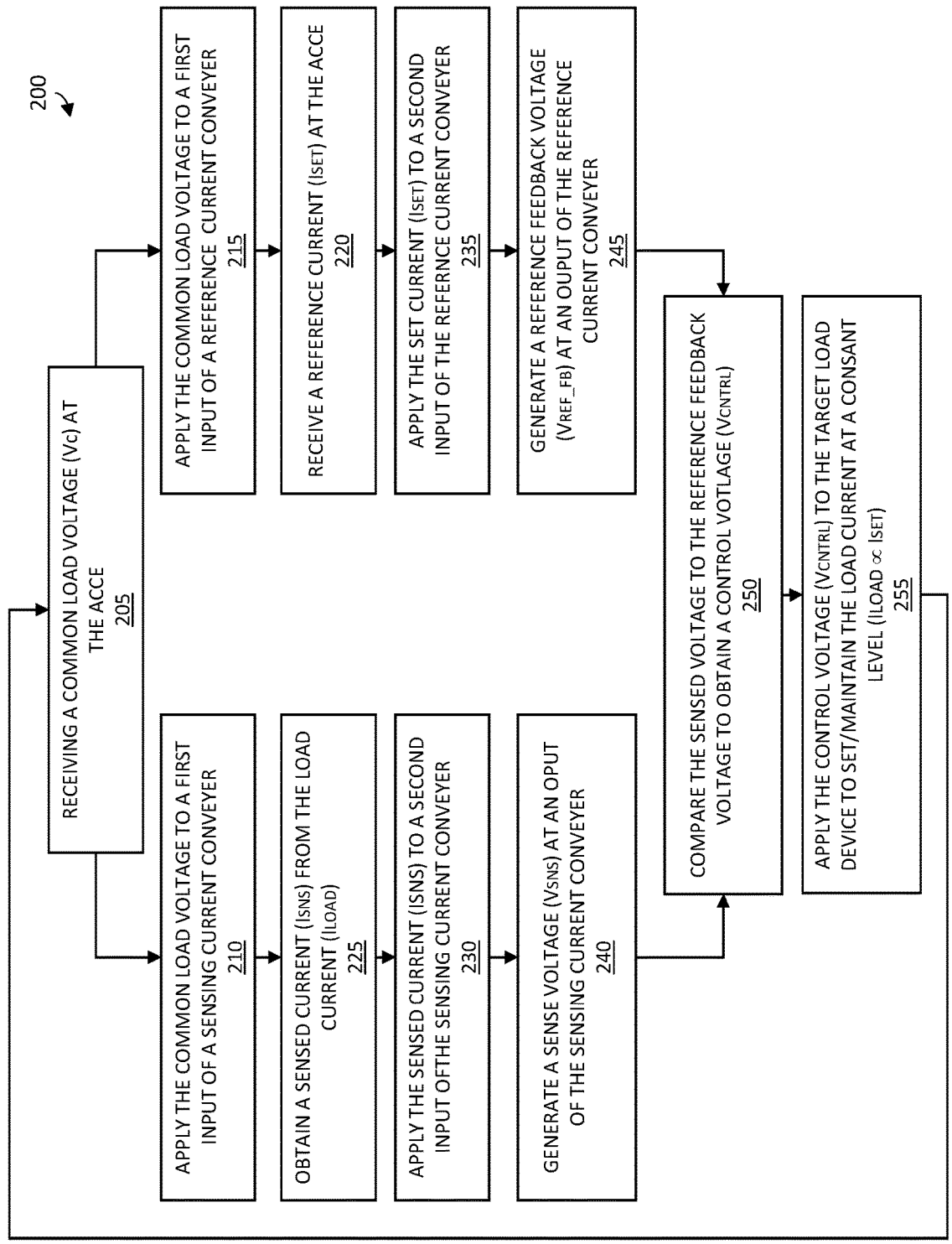
FIG. 2 is a flow chart of a method for controlling a current in a target load device according to an implementation of the present disclosure.

The ACCE 100 can be configured to set/maintain the load current ($I_{LOAD}$) at a constant level according to a process (i.e., method) illustrated by the flowchart of FIG. 2. In the method 200, a common load voltage ($V_C$) is received 205 at the ACCE 100 (e.g., from a node 150C in the remote circuit 110). The common load voltage $V_C$ may then be applied 210 to a first input 150A of sensing current conveyer 130 and applied 215 to a first input 150B of a reference current conveyer 140.

The method 200 further includes receiving 220 a reference current at the ACCE. The reference current ($I_{SET}$) may be at a predetermined or computed level based on a desired load current ($I_{LOAD\_DESIRED}$) level in the remote circuit 110. The set current may correspond to the desired load current but may not equal the desired load current. For example, the set current may be a fraction (K) of the desired load current, such as $I_{SET}=K \cdot I_{LOAD\_DESIRED}$, where K≤1.

The method further includes obtaining 225 (i.e., measuring, sensing, etc.) a sensed current ($I_{SNS}$) based on an (actual) load current (i.e., $I_{LOAD}$) of the target load device 120. The sensed current may correspond to the (actual) load current but may not equal the (actual) load current. For example, the sensed current may be the fraction (K) of the (actual) load current, such as $I_{SNS}=K \cdot I_{LOAD}$. In a steady state the sensed current is made equal to the set current by a feedback loop in the ACCE (i.e., $I_{LOAD}=I_{LOAD\_DESIRED}$).

The method further includes applying 230 the sensed current ($I_{SNS}$) to a second input 155A of the sensing current conveyer 130 and applying 235 the set current ($I_{SET}$) to a second input 155B of the reference current conveyer 140. The method further includes generating 240 (based on $V_C$ and $I_{SNS}$) a sensed voltage $V_{SNS}$ at an output 157A of the sensing current conveyer 130 and generating 245 (based on $V_C$ and $I_{SET}$) a reference-feedback voltage ($V_{REF\_FB}$) at an output 157B of the reference current conveyer 140. The method includes comparing 250 (e.g., using a differential amplifier 160) the sensed voltage ($V_{SNS}$) to the reference-feedback voltage ($V_{REF\_FB}$) to obtain a control voltage ($V_{CTRL}$). The control voltage is applied 255 (i.e., fed back) to the remote circuit 110 (e.g., to a controlling terminal 170 of the target load device 120) to set/maintain the load current ($I_{LOAD}$) at a constant level. As mentioned, the constant level can be $I_{LOAD\_DESIRED}$, or put mathematically $I_{LOAD}=I_{LOAD\_DESIRED} \propto I_{SET}$.

Figure 3:
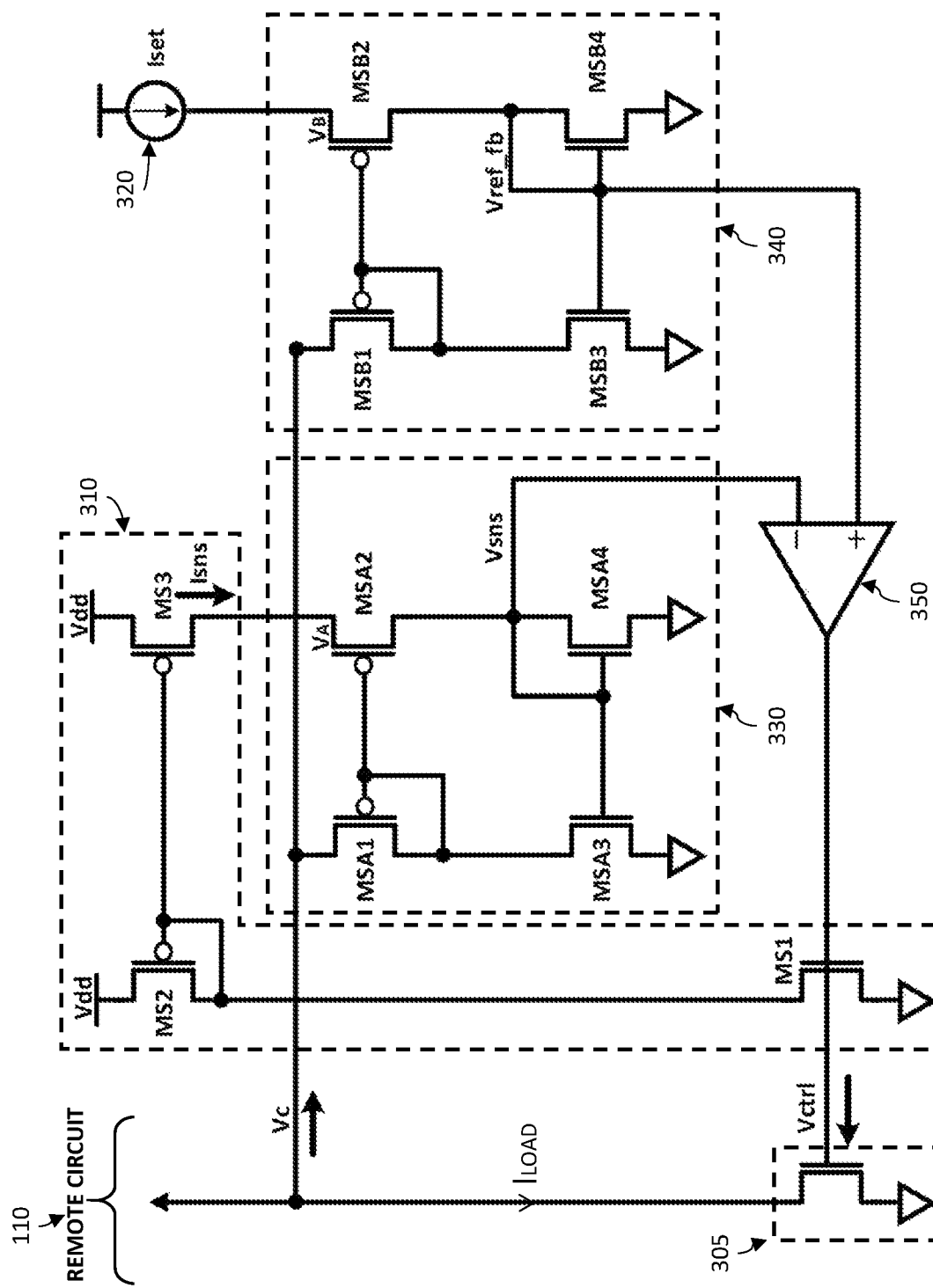
FIG. 3 is a schematic of a first possible implementation of an adaptive constant current engine for controlling the current in a target load device.

FIG. 3 is a schematic of a first possible implementation of an ACCE for controlling the current in a target load device of a remote circuit 110. The ACCE includes a sensing current conveyer 130, a reference current conveyer 140, and a load-current sensing circuit 310. The first possible implementation of FIG. 3 may also be referred to as a "low side ACCE" or a "sinking ACCE" because the sensing current conveyer 130 sinks $I_{SNS}$ from the load-current sensing circuit 310 and the reference current conveyer 140 sinks $I_{SET}$ from a reference current source 320.

The target load device of the remote circuit is shown as a transistor device. The transistor device may be a metal-oxide-semiconductor field-effect transistor (MOSFET), a bipolar junction transistor (BJT), or an insulated-gate bipolar transistor (IGBT). Additionally, the target load device may be a transistor (or a group of transistors functioning together as a single transistor device) that is of a P-type or an N-type. The target load device for the possible implementation shown in FIG. 3 is a N-type MOSFET (i.e., NMOS) transistor 305. The load current ($I_{LOAD}$) flows between a drain terminal and a source terminal of the NMOS transistor 305. The load current is controlled by a control voltage $V_{CTRL}$ at a gate terminal of the NMOS transistor 305, which is coupled to an output of the ACCE. The operation of the NMOS transistor 305 can produce a common load voltage, $V_C$, at a drain terminal of the NMOS transistor. For the purposes of this discussion, the NMOS transistor 305 is referred to as the target load device even though the target load device may be implemented differently.

The ACCE includes a load-current sensing circuit 310 configured to sense the load current ($I_{LOAD}$) of the target load device 120. The load-current sensing circuit 310 includes a first transistor MS1 (i.e., a sense transistor) that is also controlled with the control voltage $V_{CTRL}$ to sink a current. The amount of current sunk by MS1 can be a fraction (e.g., K) of $I_{LOAD}$, as described previously. The precise fraction may result from a particular design of MS1 based on an expected $V_{CTRL}$, $I_{LOAD}$, and/or $I_{SET}$.

The load-current sensing circuit 310 for the low-side ACCE implementation also includes a current mirror. The current mirror of the load-current sensing circuit 310 includes a pair of matched transistors, MS2 and MS3. The pair of matched transistors may each be a P-type metal-oxide-semiconductor field-effect transistor (i.e., PMOS). Each of the pair of matched transistors may be attached at a source terminal to a power supply (i.e., rail) voltage ($V_{dd}$) and attached to the sense transistor (MS1) so that the fractional current sunk by MS1 flows through MS2 and is mirrored to also flow through MS3 (i.e., as $I_{SNS}$). In other words, the current mirror (formed by the pair of matched transistors MS2 and MS3) can function as a current source with a level ($I_{SNS}$) that is determined by the current sunk by the first transistor MS1, which in turn, is determined by the control voltage ($V_{CTRL}$) at its gate terminal.

The ACCE also includes a sensing current conveyer 330. The sensing current conveyer 330 includes a first current mirror (i.e., a first sensing current mirror) formed by a pair of matched PMOS transistors, MSA1 and MSA2. In other words, the first current mirror of the sensing current conveyer includes a first transistor MSA1 and a second transistor MSA2 with similar (e.g., matched, substantially matched) characteristics (e.g., channel dimensions, doping, etc.). The first transistor (MSA1) has a gate terminal shorted with a drain terminal so that the MSA1 transistor operates as a diode-connected transistor. A common load voltage $V_C$ is coupled to a source terminal of the MSA1 transistor. The first current mirror topology, the matching of the pair of transistors (MSA1, MSA2), and the operation of the transistors (MSA1, MSA2) in saturation generates identical source-gate voltages ($V_{SG}$) across MSA1 and MSA2. This condition results in a voltage $V_A$ produced at the source terminal of MSA2 that equals (i.e., is common with) $V_C$ (i.e., $V_A=V_C$). The second transistor MSA2 is coupled to and conducts $I_{SNS}$ from the load-current sensing circuit 310.

The sensing current conveyer 330 further includes a second current mirror (i.e., a second sensing current mirror) formed by a pair of matched NMOS transistors, MSA3 and MSA4. In other words, the second current mirror of the sensing current conveyer 330 includes a first transistor MSA3 and a second transistor MSA4. The second transistor MSA4 has a gate terminal shorted with a drain terminal so that the second transistor MSA4 operates as a diode-connected transistor. The diode-connected transistor MSA4 is in series with MSA2.

Accordingly, $I_{SNS}$ conducted by MSA2 is also conducted by MSA4. As mentioned MSA4 operates as a diode. Accordingly, a sensed voltage ($V_{SNS}$) is produced that corresponds to the sensed current ($I_{SNS}$). Thus, the sensing current conveyer 130 is configured to receive a common load voltage ($V_C$) from the remote circuit 110 and a sensed current ($I_{SNS}$) from the load-current sensing circuit 310. Based on these inputs the sensing current conveyer 330 is configured to output the sensed voltage ($V_{SNS}$).

The ACCE also includes a reference current conveyer 140. The reference current conveyer 140 includes a first current mirror (i.e., first reference current mirror) formed by a pair of matched PMOS transistors, MSB1 and MSB2. In other words, the first current mirror of the sensing current conveyer includes a first transistor MSB1 and a second transistor MSB2 with similar (e.g., matched) characteristics (e.g., channel dimensions, doping, etc.). The first transistor (MSAB1) has a gate terminal shorted with a drain terminal so that the MSB1 transistor operates as a diode-connected transistor. A common load voltage $V_C$ is coupled to a source terminal of the MSB1 transistor. The first current mirror topology, the matching of the pair of transistors (MSB1, MSB2), and the operation of the transistors (MSB1, MSB2) in saturation generates identical source-gate voltages ($V_{SG}$) across MSB1 and MSB2. This condition results in a voltage $V_B$ produced at the source of MSA2 that equals (i.e., is common with) $V_C$ (i.e., $V_B=V_C$).

The second transistor MSB2 is coupled to and conducts $I_{SET}$ from a reference current source 320 (e.g., a reference current source external to the ACCE). As mentioned previously, the level ($I_{SET}$) of the reference current source 320 may correspond to a desired operating characteristic of the target load device (i.e., NMOS transistor 305). For example, $I_{SET}$ may be a fraction (e.g., K) of a desired load current. $I_{SET}$ may be a fixed (i.e., constant) value but can be adjusted, in a possible implementation, to produce different operating characteristics in the remote circuit 110.

The reference current conveyer 340 further includes a second current mirror (i.e., second reference current mirror) formed by a pair of matched NMOS transistors, MSB3 and MSB4. In other words, the second current mirror of the reference current conveyer 140 includes a first transistor MSB3 and a second transistor MSB4 with similar (e.g., matched) characteristics (e.g., channel dimensions, doping, etc.). The second transistor MSB4 has a gate terminal shorted with a drain terminal so that the second transistor MSB4 operates as a diode-connected transistor. The diode-connected transistor MSB4 is in series with MSB2. Accordingly, $I_{SET}$ conducted by MSB2 is also conducted by MSB4. As mentioned MSB4 operates as a diode. Accordingly, a reference-feedback voltage ($V_{REF\_FB}$) is produced that corresponds to the set current ($I_{SET}$). Thus, the reference current conveyer 340 is configured to receive a common load voltage ($V_C$) from the remote circuit 110 and a set current ($I_{SET}$) from the reference current source 320. Based on these inputs, the sensing current conveyer 340 is configured to output the reference-feedback voltage ($V_{REF\_FB}$).

The first transistor MSB1 and the second transistor MSB2 of the first current mirror of the reference current conveyer 340 are also matched to the first transistor MSA1 and the second transistor MSA2 of the first current mirror of the sensing current conveyer 330. Likewise, the first transistor MSB3 and the second transistor MSB4 of the second current mirror of the reference current conveyer 340 are matched to the first transistor MSA3 and the second transistor MSA4 of the second current mirror of the sensing current conveyer 330. In this way, the operating points of the transistors MSA2 and MSB2 are made identical (i.e. $V_C=V_A=V_B$) so that differences between $I_{SNS}$ and $I_{SET}$ can be accurately measured as differences between $V_{SNS}$ and $V_{REF\_FB}$.

The sensing current conveyer 330 and the reference current conveyer 340 are said to be in a butterfly configuration because each have matching topologies and matching devices. In the butterfly configuration, the sensing current conveyer 330 and the reference current conveyer 340 are coupled together at respective first transistors of first current mirrors so that the respective second transistors of the first current mirrors have identical input conditions (i.e. $V_C=V_A=V_B$) for receiving input currents, $I_{SNS}$ and $I_{SET}$.

The output of the sensing current conveyer 330 ($V_{SNS}$) may be coupled to a first input terminal of a differential amplifier, while the output of the reference current conveyer 340 ($V_{REF\_FB}$) may be coupled to a second input terminal of a differential amplifier. In the example implementation of FIG. 3, the differential amplifier is an operational amplifier (i.e. opamp) 350 and the first input is an inverting input of the opamp, while the second input is a non-inverting input of the opamp.

When opamp forces the $V_{SNS}$ and $V_{REF\_FB}$ voltages to be equal it is both driving the $I_{SNS}$ current to match the $I_{SET}$ current as well as maintaining the LOAD current in the remote circuit as a constant value that is proportional to $I_{SNS}$. This control achieved through $V_{CTRL}$, which is driving both the target load current LOAD and the sensed current $I_{SNS}$ (i.e., via the load-current sensing circuit). In some implementations, the opamp may include one or more inputs (not shown) for receiving one or more biasing signals to bias $V_{CTRL}$.

Figure 4:
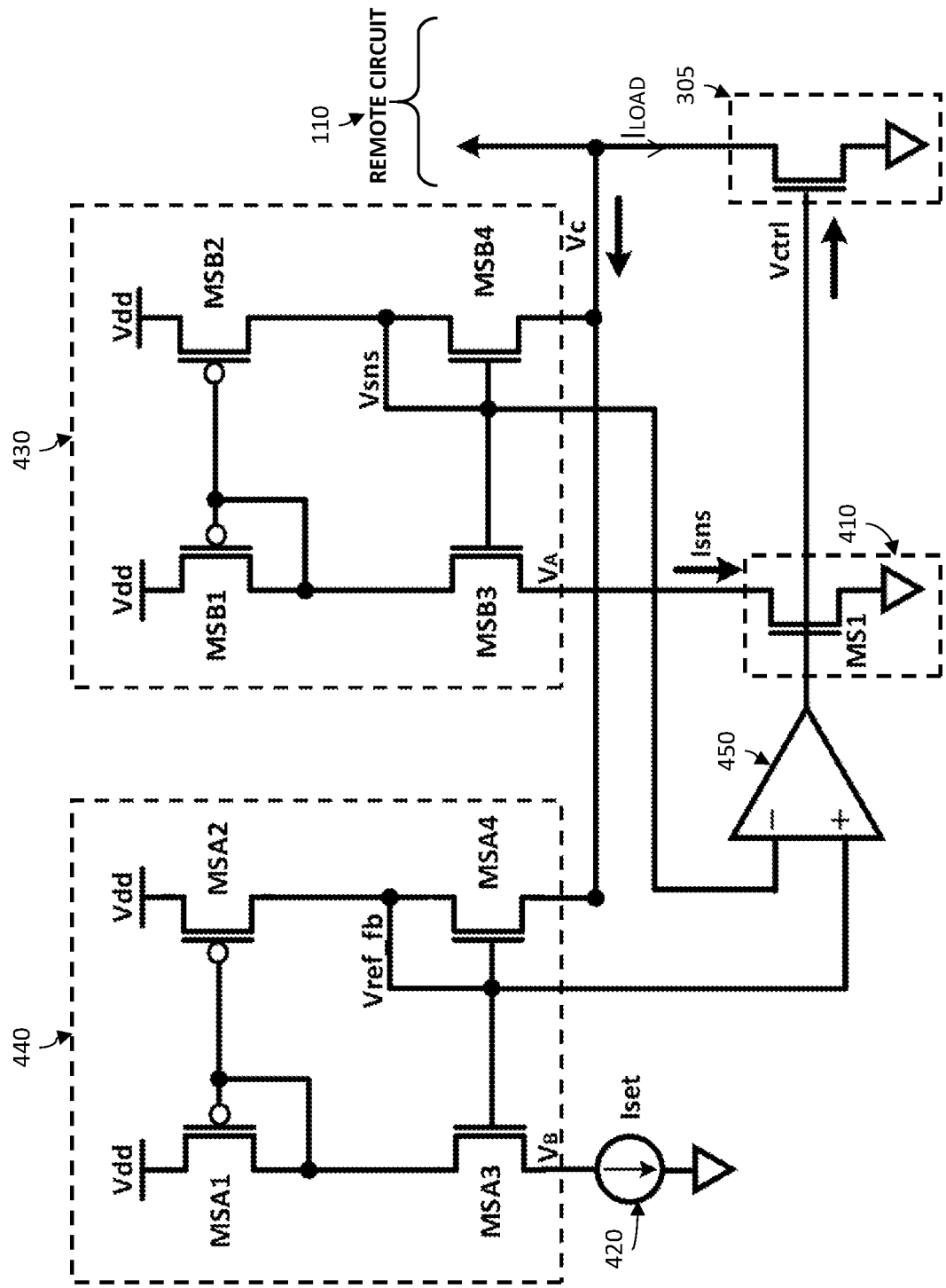
FIG. 4 is a schematic of a second possible implementation of an adaptive constant current engine for controlling the current in a target load device.

As mentioned, FIG. 3 illustrates a possible "low-side" or "sinking" configuration of the ACCE. It is also possible to realize the ACCE in a "high-side" or "sourcing" configuration. FIG. 4 is a schematic of a second possible (i.e., sourcing) implementation of an adaptive constant current engine for controlling the current in a target load device. The ACCE of FIG. 4 is referred to as a "high side ACCE" or a "source ACCE" because it includes a sensing current conveyer 430 sources $I_{SNS}$ and a reference current conveyer 440 sources $I_{SET}$.

As before, the target load device of the remote circuit 110 in FIG. 4 is implemented as a transistor device (i.e., NMOS transistor 305). The load current ($I_{LOAD}$) of the transistor device is controlled by a control voltage $V_{CTRL}$ at its gate terminal. The ACCE senses the load current using a load-current sensing circuit 410. The load-current sensing circuit 410 includes a sense (i.e., sensing) transistor MS1 that is driven with the same gate voltage as applied to the target load device (i.e., $V_{CTRL}$) in order to sink a sensed current ($I_{SNS}$) that can be a fraction (K) of the load current. The load-current sensing circuit of the high-side implementation of FIG. 4 does not require a current mirror to source current the sensing current conveyer 430 because MS1 is coupled (e.g., directly connected) to a low side (i.e., bottom side) of the sensing current conveyer 430 (i.e., the sensing current conveyer 430 is on the high side of MS1).

The sensing current conveyer 430 includes a first current mirror formed by a pair of matched PMOS transistors, MSB1 and MSB2 and a second current mirror formed by a pair of matched NMOS transistors MSB3 and MSB4. A common load voltage $V_C$ is coupled to a source terminal of the MSB4 transistor. The sensing current conveyer topology, the matching of the pair of transistors (MSB3, MSB4), and the operation of the transistors (MSB3, MSB4) in saturation generates identical source-gate voltages ($V_{SG}$) across MSB3 and MSB4. This condition results in a voltage $V_A$ produced at the source of MSB3 that equals (i.e., is common with) $V_C$ (i.e., $V_A=V_C$). The transistor MSB3 is coupled to and sources $I_{SNS}$ to the load-current sensing circuit 310. The $I_{SNS}$ current flowing through MSB3 produces a voltage across the diode connected transistor MSB1, which is reflected to the source terminal of the MSB2 transistor as $V_{SNS}$. The $V_{SNS}$ node of the sensing current conveyer (i.e., the source terminal of the MSB2 transistor) is coupled to an input (e.g., an inverting terminal) of an opamp 450.

The high-side ACCE shown in FIG. 4 also includes a reference current conveyer 440. The reference current conveyer 440 includes a first current mirror formed by a pair of matched PMOS transistors, MSA1 and MSA2. The transistors MSA1 and MSA2 are also matched to MSB1 and MSB2. The reference current conveyer 440 also includes a second current mirror formed by a pair of matched NMOS transistors MAB3 and MSA4. The transistors MSA3 and MSA4 are also matched to MSB3 and MSB4. A common load voltage $V_C$ is coupled to a source terminal of the MSA4 transistor. The reference current conveyer topology, the matching of the pair of transistors (MSA3, MSA4), and the operation of the transistors (MSA3, MSA4) in saturation generates identical source-gate voltages ($V_{SG}$) across MSA3 and MSA4. This condition results in a voltage $V_B$ produced at the source of MSA3 that equals (i.e., is common with) $V_C$ (i.e., $V_B=V_C$). The transistor MSA3 is coupled to and sources $I_{SET}$ to a reference current source 420. The $I_{SET}$ current flowing through MSA3 produces a voltage across the diode connected transistor MSA1, which is reflected to the source terminal of the MSA2 transistor as $V_{REF\_FB}$. The $V_{REF\_FB}$ node of the sensing current conveyer (i.e., the source terminal of the MSB2 transistor) is coupled to an input (e.g., a non-inverting terminal) of the opamp 450. The opamp outputs the control voltage $V_{CTRL}$ based on the difference between $V_{SNS}$ and $V_{REF\_FB}$. Biasing (not shown) may set a steady-state voltage level for $V_{CTRL}$ when the load current is at its desired level (i.e., when $V_{SNS}=V_{REF\_FB}$).

Either the sinking configuration of the ACCE (FIG. 3) or the sourcing configuration of the ACCE (FIG. 4) may be implemented to control and maintain the target load current proportional to the (constant) reference current under all conditions (i.e., independent of process corners and/or temperatures). The high-side (i.e., sourcing) implementation shown in FIG. 4 may advantageously have a faster load-current sensing circuit response, because it does not require a current mirror, as the low-side (i.e., sinking) implementation shown in FIG. 3 does. Additionally, the high-side implementation shown in FIG. 4 may be able to maintain all transistors (i.e., MSA1, MSA2, MSA3, MSA4, MSB1, MSB2, MSB3, MSB4) in saturation at a lower supply voltage ($V_{dd}$) than the low-side implementation shown in FIG. 3

The target load device 120 of the remote circuit 110 is a N-type MOSFET (i.e., NMOS) transistor. A load current ($I_{LOAD}$) flows between a drain terminal and a source terminal of the NMOS transistor. The load current is controlled by a control voltage $V_{CTRL}$ at a gate terminal of the NMOS transistor. The operation of the NMOS transistor can produce a common load voltage, $V_C$, at a drain terminal of the NMOS transistor. As mentioned previously, the target load device 120 may be implemented otherwise. For example, the target load device may be any transistor device (e.g., BJT, JFET, MOSFET, etc.) and may be a P-type or an N-type device. For example, the circuits described thus far may be adapted to include a P-type FET (e.g., MOSFET) target load device.

Figure 5:
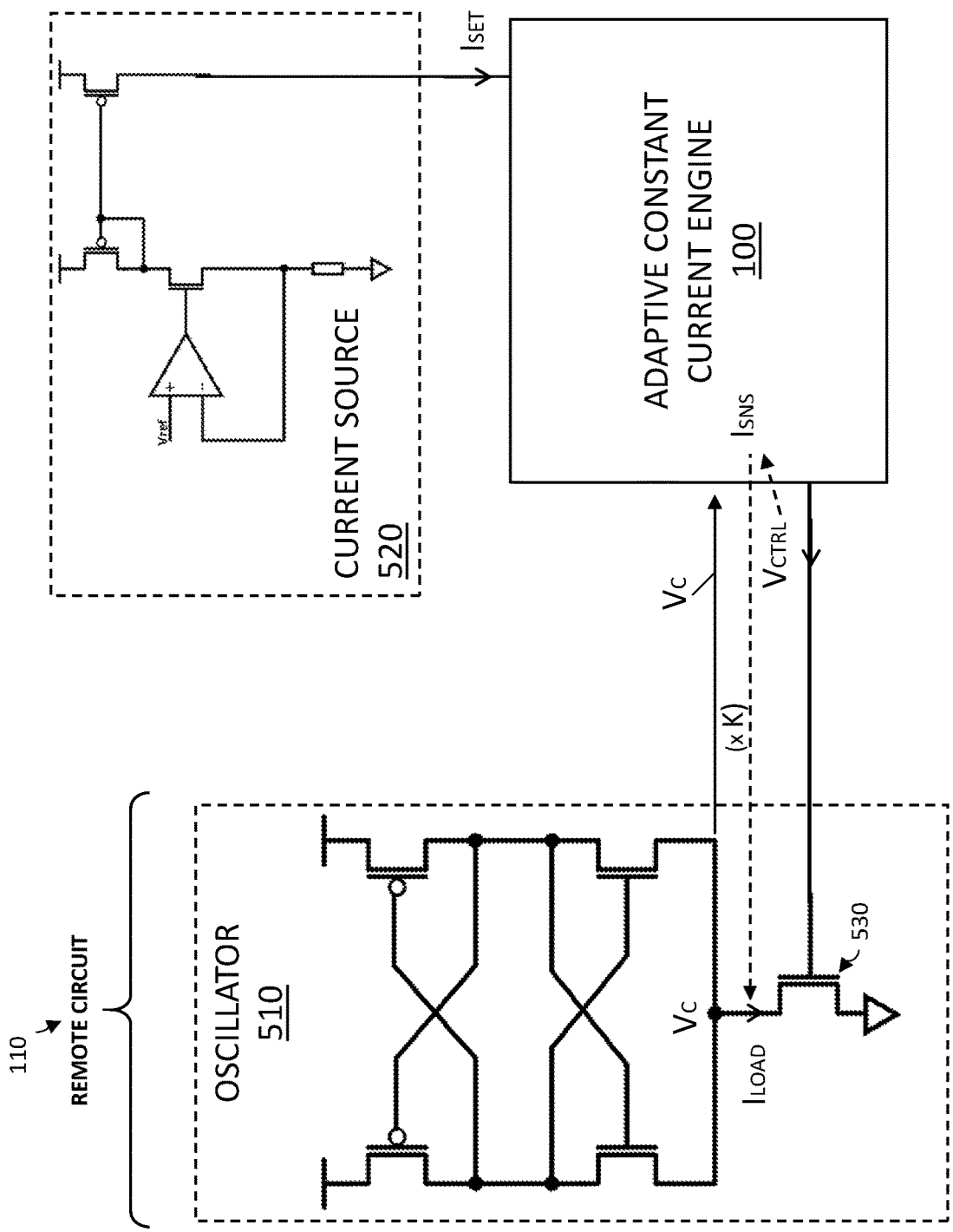
FIG. 5 is block diagram schematic of a system utilizing an adaptive constant current engine to insure stable operation.

The ACCE of the present disclosure may be used various applications. For the purposes of instruction, on possible implementation of the ACCE in an application is shown in FIG. 5. FIG. 5 illustrates a block diagram schematic of a system utilizing an adaptive constant current engine to insure stable operation. The system includes an oscillator 510 that is controlled by an ACCE 100 according to a set (reference) current provided by a current source 520. The oscillator in this implementation is a LC voltage-controlled oscillator (VCO) that is biased using a transistor device. In other words, the remote circuit 110 controlled by the ACCE 100 includes an oscillator with a bias current ($I_{LOAD}$) controlled by a target load device embodied as an NMOS transistor 530. When the bias current is controlled in this way, variations in operation can result as the NMOS transistor varies over process corners and temperature. The ACCE 100 is used to control the LC VCO bias current (i.e., $I_{LOAD}$) for all corners with minimal variation. The ACCE 100 allows the load current to be reduced for typical corners and kept the same for other corners, thus eliminating yield problems resulting from slow corners/temperatures.

The disclosed methods and circuits can be used in applications requiring LC oscillators to transmit discrete on/off type of signals in products like IGBT gate drivers with internal magnetic isolation. For example, in IGBT gate driver applications; where a VCO is used to transmit enable signals from one integrated circuit (IC) to another within a package with magnetic isolation, the VCO consumes a lot of current. The disclosed ACCE can help to reduce the current consumption under normal conditions while still maintaining proper operating current at low corners and temperatures.

More generally, the disclosed methods and circuits can be used in other applications requiring current/power consumption to stay constant over ranges of processes and temperature, and in this way, may increase margins allowing for more to variations. For example, the ACCE can simplify designs (e.g., reduce part count) by eliminating the need to accommodate process corners and temperature variations. This simplification can correspond to a reduced system part count by eliminating parts that are otherwise included to handle large variations. This part-count reduction may, in turn, reduce a possibility of failure. The disclosed circuits offer ability to set and maintain a constant current load in a remote circuit using a small number (e.g., 9 to 11) transistors (e.g., small FETs) and relatively simple one or two stage opamp.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

It will be understood that, in the foregoing description, when an element, such as a component is referred to as connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A circuit comprising:
   a reference current conveyer configured to receive a common load voltage at a first input of the reference current conveyer and to receive a reference current at a second input of the reference current conveyer, and configured to generate a reference-feedback voltage at an output of the reference current conveyer based on the common load voltage and the reference current;
   a sensing current conveyer configured to receive the common load voltage at a first input of the sensing current conveyer and to receive a sensed current at a second input of the sensing current conveyer, and configured to generate a sensed voltage at an output of the reference current conveyer based on the common load voltage and the sensed current, wherein the sensing current conveyer and the reference current conveyer are coupled to each other in a butterfly configuration, the butterfly configuration characterized by the sensing current conveyer and the reference current conveyer having matching devices and topologies that are substantially the same; and
   a differential amplifier configured to receive the reference-feedback voltage at a first input of the differential amplifier and the sensed voltage at a second input of the differential amplifier and configured to generate a control voltage at an output of the differential amplifier that corresponds to a difference between the sensed voltage and the reference-feedback voltage, the difference unaffected by variations of the common load voltage.

2. The circuit according got claim 1, wherein the butterfly configuration includes the first input of the reference current conveyer coupled directly to the first input of the sensing current conveyer.

3. The circuit according to claim 2, wherein:
   the common load voltage at the first input of the reference current conveyer is transferred to the second input of the reference current conveyer and the common load voltage at the first input of the sensing current conveyer is transferred to the second input of the sensing current conveyer so that the reference current and the sensed current experience a load condition that is substantially the same.

4. The circuit according to claim 1, wherein:
   the reference current conveyer includes a first reference current mirror coupled to a second reference current mirror;
   the sensing current conveyer includes a first sensing current mirror coupled to a second sensing current mirror, the first reference current mirror includes transistors that are matched with transistors of the first sensing current mirror; and
   the second reference current mirror includes transistors that are matched with transistors of the second reference current mirror.

5. The circuit according to claim 1, wherein:
   the reference-feedback voltage is a voltage across a diode connected transistor of reference current conveyer; and
   the sensed voltage is a voltage across a diode connected transistor of the sensing current conveyer.

6. The circuit according to claim 5, wherein the diode connected transistor of the reference current conveyer is matched to the diode connected transistor of the sensing current conveyer.

7. The circuit according to claim 1, wherein the sensed current is generated by a load current sensing circuit that includes a sense transistor coupled at its gate to the control voltage and configured to conduct the sensed current based on the control voltage.

8. The circuit according to claim 7, wherein the sensing current conveyer sinks current from a current mirror coupled to the sense transistor.

9. The circuit according to claim 7, wherein the sensing current converter sources current to the sense transistor.

10. The circuit according to claim 1, wherein the differential amplifier is an opamp.

11. The circuit according to claim 10, wherein the opamp is configured to apply a bias voltage to the control voltage.

12. A method for setting and maintaining a load current in a target load device to a constant level, the method comprising:
   receiving a common load voltage from a remote circuit at an adaptive constant current engine including a load current sensing circuit, a sensing current conveyer, a reference current conveyer, and a differential amplifier;
   applying the common load voltage to a first input of the sensing current conveyer;
   applying the common load voltage to a first input of a reference current conveyer;
   obtaining a sensed current using the load current sensing circuit, the sensed current a fraction of the load current;
   applying the sensed current to a second input of the sensing current conveyer;
   receiving a reference current from a reference current source at the adaptive constant current engine;
   applying the reference current to a second input of the reference current conveyer;
   generating a sensed voltage at an output of the sensing current conveyer based on the common load voltage and the sensing current;
   generating a reference-feedback voltage at an output of the sensing current conveyer based on the common load voltage and the reference current;
   comparing the sensed voltage to the reference-feedback voltage to obtain a control voltage; and
   applying the control voltage to the target load device to set and maintain the load current at a constant level.

13. The method according to claim 12, wherein the obtaining a sensed current using the load current sensing circuit includes:
   applying the control voltage to a sense transistor to generate the sense current.

14. The method according to claim 13, wherein the applying the sensing current to a second input of the sensing current conveyer comprises:
   sinking the sense current from a current mirror coupled to the sense transistor.

15. The method according to claim 13, wherein the applying the sensing current to a second input of the sensing current conveyer includes:
   sourcing the sense current to the sense transistor.

16. A system for maintaining a constant current, the system comprising:

a target load device in a remote circuit, the target load device having a common load voltage and conducting a load current;

a reference current source providing a reference current proportional to the load current; and an adaptive constant current engine configured to sense a sense current that is proportional to the load current and compare the sensed current to the reference current to produce a control voltage that is coupled to the target load device to control the load current, the adaptive constant current engine including:

a load current sensing circuit configured to receive the control voltage and generate the sensed current;

a sensing current conveyer operating at a common load voltage from the remote circuit and generating a sensed voltage based on the sensed current;

a reference current conveyer operating at the common load voltage from the remote circuit and generating a reference-feedback voltage based on the reference current; and a differential amplifier configured to generate the control voltage based on a difference between the sensed voltage and the reference-feedback voltage, the sensing current conveyer and the reference current conveyer being matched so that the difference is independent of the common load voltage.

17. The system according to claim 16, wherein the remote circuit is an oscillator.

18. The system according to claim 17, wherein the target load device is a NMOS transistor configured to control a bias of the oscillator.

19. The system according to claim 16, wherein the adaptive constant current engine is a high side adaptive constant current engine in which the sensing current conveyer sources a current to the load current sensing circuit.

20. The system according to claim 16, wherein the adaptive constant current engine is a low side adaptive constant current engine in which the sensing current conveyer sinks a current from the load current sensing circuit.

21. The system according to claim 16, wherein the sensing current conveyer and the reference current conveyer have matching topologies and matching devices, and both the sensing current conveyer and the reference current conveyer are coupled to the common load voltage so that variations in the common load voltage are received by each.

* * * * *